(12) United States Patent
Yang

(10) Patent No.: US 10,970,513 B2
(45) Date of Patent: Apr. 6, 2021

(54) ARRAY SUBSTRATE, DISPLAY SCREEN, AND ELECTRONIC DEVICE

(71) Applicant: Guangdong Oppo Mobile Telecommunications Corp., Ltd., Guangdong (CN)

(72) Inventor: Le Yang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 12 days.

(21) Appl. No.: 16/514,309

(22) Filed: Jul. 17, 2019

(65) Prior Publication Data

US 2020/0042766 A1 Feb. 6, 2020

(30) Foreign Application Priority Data

Jul. 31, 2018 (CN) .......................... 201810858393.8

(51) Int. Cl.
*G06K 9/00* (2006.01)
*H01L 27/12* (2006.01)
(Continued)

(52) U.S. Cl.
CPC ......... *G06K 9/0004* (2013.01); *G02F 1/1368* (2013.01); *G02F 1/133512* (2013.01);
(Continued)

(58) Field of Classification Search
CPC ............ G06K 9/0004; G02F 1/133512; G02F 1/136286; G02F 1/1368; H01L 27/124; H01L 27/1248; H01L 27/1443
See application file for complete search history.

(56) References Cited

U.S. PATENT DOCUMENTS 5,446,564 A 8/1995 Mawatari et al.
2009/0279029 A1 11/2009 Kunii et al.
(Continued)

FOREIGN PATENT DOCUMENTS

CN 105095883 A 11/2015
CN 204808837 U 11/2015
(Continued)

OTHER PUBLICATIONS

International search report issued in corresponding international application No. PCT/CN2019/093645 dated Oct. 10, 2019.
(Continued)

*Primary Examiner* — Lixi C Simpson

(57) ABSTRACT

An array substrate is provided. The array substrate includes a first base material, and a display circuit layer and a recognition circuit layer laminated on the first base material. The display circuit layer includes multiple gate lines, multiple data lines, and multiple thin-film transistors (TFT). Projections of the multiple gate lines on the first base material and projections of the multiple data lines on the first base material define multiple sub-pixel projection areas. Each of projections of the multiple TFTs on the first base material falls into a corresponding area of the multiple sub-pixel projection areas. The recognition circuit layer includes multiple photoelectric sensors. Projections of the multiple photoelectric sensors on the first base material fall into different areas of the sub-pixel projection areas. The photoelectric sensor is configured to sense target lights carrying user fingerprint information. A display screen and an electronic device are further provided.

16 Claims, 11 Drawing Sheets

(51) Int. Cl.
  *G02F 1/1362* (2006.01)
  *G02F 1/1335* (2006.01)
  *G02F 1/1368* (2006.01)
  *H01L 27/144* (2006.01)

(52) U.S. Cl.
  CPC ...... *G02F 1/136286* (2013.01); *H01L 27/124* (2013.01); *H01L 27/1248* (2013.01); *H01L 27/1443* (2013.01)

(56) References Cited

U.S. PATENT DOCUMENTS

| | | | |
|---|---|---|---|
| 2010/0007632 A1* | 1/2010 | Yamazaki | G06F 21/32 345/175 |
| 2010/0164906 A1 | 7/2010 | Fukunaga et al. | |
| 2011/0069038 A1 | 3/2011 | Fann et al. | |
| 2012/0321149 A1 | 12/2012 | Carver et al. | |
| 2015/0187830 A1 | 7/2015 | Dai | |
| 2016/0266695 A1* | 9/2016 | Bae | G06K 9/00053 |
| 2017/0078513 A1* | 3/2017 | Chang | H04N 1/10 |
| 2019/0303638 A1* | 10/2019 | Zeng | G06F 3/0488 |
| 2020/0160023 A1* | 5/2020 | Hu | G02B 1/005 |

FOREIGN PATENT DOCUMENTS

| | | |
|---|---|---|
| CN | 105807521 A | 7/2016 |
| CN | 106611170 A | 5/2017 |
| CN | 106873269 A | 6/2017 |

OTHER PUBLICATIONS

Extended European search report issued in corresponding European application No. 19184235.0 dated Oct. 29, 2019.
The second office action with English Translation issued in corresponding CN application No. 201810858393.8 dated Nov. 10, 2020.
Communication pursuant to Article 94(3) EPC issued in corresponding European application No. 19184235.0 dated Dec. 15, 2020.

\* cited by examiner

ARRAY SUBSTRATE, DISPLAY SCREEN, AND ELECTRONIC DEVICE

CROSS-REFERENCE TO RELATED APPLICATIONS

This application claims priority to Chinese Patent Application No. 201810858393.8, filed on Jul. 31, 2018, the disclosure of which is hereby incorporated by reference in its entirety.

TECHNICAL FIELD

The present disclosure relates to the field of electronic technology, and more particularly to an array substrate, a display screen, and an electronic device.

BACKGROUND

A fingerprint identification module of a conventional electronic device occupies space of a non-display area of the electronic device, which limits increase in screen-to-body ratio of the electronic device. However, with increasingly higher requirements on the screen-to-body ratio of the electronic device by a user, the problem on how to decrease the area of the non-display area of the electronic device occupied by the fingerprint identification module, to increase the screen-to-body ratio of the electronic device needs to be solved.

SUMMARY

In an aspect of the present disclosure, an array substrate is provided. The array substrate includes a first base material, and a display circuit layer and a recognition circuit layer laminated on the first base material. The display circuit layer includes multiple gate lines, multiple data lines, and multiple thin-film transistors (TFT). Projections of the multiple gate lines on the first base material and projections of the multiple data lines on the first base material define multiple sub-pixel projection areas. Each of projections of the multiple TFTs on the first base material falls into a corresponding area of the multiple sub-pixel projection areas. The recognition circuit layer includes multiple photoelectric sensors. Each of projections of the multiple photoelectric sensors on the first base material falls into a corresponding area of the sub-pixel projection areas. The photoelectric sensor is configured to sense target lights carrying user fingerprint information.

In another aspect of the present disclosure, a display screen is further provided. The display screen includes a color film substrate, a liquid crystal layer, and the array substrate described above. The liquid crystal layer is located between the color film substrate and the array substrate.

In yet another aspect of the present disclosure, an electronic device is provided. The electronic device includes a controller and the display screen described above. The controller is electrically coupled with the display screen.

BRIEF DESCRIPTION OF THE DRAWINGS

In order to describe more clearly technical solutions of the present disclosure, the following will give a brief introduction to the accompanying drawings related to embodiments of the present disclosure. Apparently, the following accompanying drawings merely illustrate some embodiments of the present disclosure. Those of ordinary skill in the art can also obtain other accompanying drawings based on the following accompanying drawings without making creative effort.

DETAILED DESCRIPTION

Figure 1:
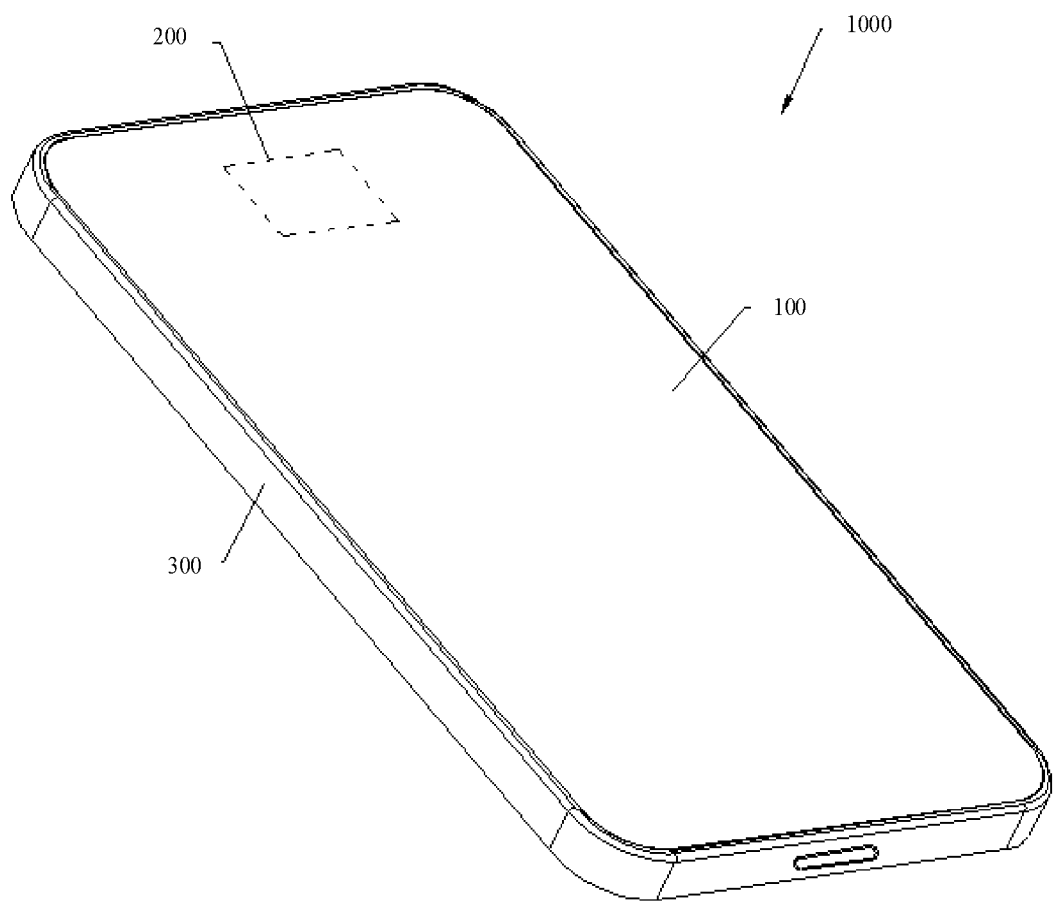
FIG. 1 is a schematic structural diagram illustrating an electronic device according to an embodiment of the present disclosure.

An array substrate is provided. The array substrate includes a first base material, and a display circuit layer and a recognition circuit layer laminated on the first base material; the display circuit layer includes a plurality of gate lines, a plurality of data lines, and a plurality of thin-film transistors (TFT), projections of the plurality of gate lines on the first base material and projections of the plurality of data lines on the first base material defining a plurality of sub-pixel projection areas, and each of projections of the plurality of TFTs on the first base material falling into a corresponding area of the plurality of sub-pixel projection areas; the recognition circuit layer includes a plurality of photoelectric sensors, projections of the plurality of photoelectric sensors on the first base material falling into a corresponding area of the sub-pixel projection areas, and the photoelectric sensor being configured to sense target lights carrying user fingerprint information.

In an embodiment, the target lights are visible lights, and the display circuit layer is located between the first base material and the recognition circuit layer.

In an embodiment, the projections of the plurality of photoelectric sensors on the first base material and the projections of the plurality of TFTs on the first base material are partially overlapped.

In an embodiment, each of the plurality of photoelectric sensors includes a cathode, a photosensitive layer, and an anode sequentially laminated. The cathode is located on one side of the photosensitive layer towards the first base material; the anode is located on one side of the photosensitive layer away from the cathode, and the anode is made of a transparent conductive material.

In an embodiment, the cathode is made of a light-shielding conductive material, and a projection of the cathode on the first base material covers a projection of the photosensitive layer on the first base material.

In an embodiment, the recognition circuit layer further includes a plurality of output wires, the plurality of output wires are respectively coupled with the cathodes of the plurality of photoelectric sensors, and the plurality of output wires and the cathodes of the plurality of photoelectric sensors are disposed on the same layer and made of the same material. Projections of the plurality of output wires on the first base material and the projections of the plurality of data lines on the first base material are partially overlapped; or the projections of the plurality of output wires on the first base material and the projections of the plurality of gate lines on the first base material are partially overlapped.

In an embodiment, the array substrate further includes a plurality of pixel electrodes, each of projections of the plurality of pixel electrodes on the first base material falls into a corresponding area of the plurality of sub-pixel projection areas, each of the plurality of pixel electrodes is electrically coupled with a corresponding one of the plurality of TFTs, and the plurality of pixel electrodes and the anodes of the plurality of photoelectric sensors are disposed on the same layer.

In an embodiment, the display circuit layer further includes a first planarization layer, the first planarization layer is located on one side of the plurality of TFTs away from the first base material and has a plurality of first through-holes, the plurality of first through-holes are aligned with the plurality of TFTs respectively, and the plurality of pixel electrodes are coupled to the plurality of TFTs through the plurality of first through-holes respectively.

In an embodiment, the cathodes of the plurality of photoelectric sensors are located on one side of the first planarization layer away from the first base material. The recognition circuit layer further includes an insulation layer, the insulation layer is located on the one side of the first planarization layer away from the first base material and covers the cathodes of the plurality of photoelectric sensors, the insulation layer has a plurality of second through-holes and a plurality of third through-holes, the plurality of second through-holes are aligned with the cathodes of the plurality of photoelectric sensors respectively, and the plurality of third through-holes communicate with the plurality of first through-holes respectively; the photosensitive layers of the plurality of photoelectric sensors are partially or wholly filled in the plurality of second through-holes respectively and are in contact with the cathodes of the plurality of photoelectric sensors; the anodes of the plurality of photoelectric sensors are located on one side of the insulation layer away from the first planarization layer and covers the photosensitive layers of the plurality of photoelectric sensors respectively; the plurality of pixel electrodes are located on the one side of the insulation layer away from the first planarization layer and are coupled to the plurality of TFTs via the plurality of third through-holes and the plurality of first through-holes respectively.

In an embodiment, the target lights are visible lights, and projections of photosensitive layers of the plurality of photoelectric sensors on the first base material and the projections of the plurality of TFTs on the first base material are misaligned.

In an embodiment, the recognition circuit layer is located between the first base material and the display circuit layer.

In an embodiment, the target lights are invisible lights, the projections of the plurality of photoelectric sensors on the first base material and the projections of the plurality of TFTs on the first base material are partially overlapped.

In an embodiment, the display circuit layer is located between the first base material and the recognition circuit layer.

In an embodiment, the recognition circuit layer further includes a plurality of output wires, the plurality of output wires are coupled with cathodes of the plurality of photoelectric sensors respectively, and the plurality of output wires and the cathodes of the plurality of photoelectric sensors are disposed on the same layer and made of the same material; and projections of the plurality of output wires on the first base material are partially overlapped with one of the projections of the plurality of gate lines on the first base material and the projections of the plurality of data lines on the first base material.

In an embodiment, the display circuit layer further includes a plurality of input wires, the plurality of input wires are coupled with anodes of the plurality of photoelectric sensors respectively, and the plurality of input wires and the anodes of the plurality of photoelectric sensors are disposed on the same layer and made of the same material; the plurality of input wires and the plurality of output wires are made of the same material; projections of the plurality of input wires on the first base material are partially overlapped with the other one of the projections of the plurality of gate lines on the first base material and the projections of the plurality of data lines on the first base material.

A display screen is also provided. The display screen includes a color film substrate, a liquid crystal layer, and an array substrate, and the liquid crystal layer being located between the color film substrate and the array substrate; the array substrate includes a first base material, and a display circuit layer and a recognition circuit layer laminated on the first base material; the display circuit layer includes a plurality of gate lines, a plurality of data lines, and a plurality of thin-film transistors (TFT), projections of the plurality of gate lines on the first base material and projections of the plurality of data lines on the first base material defining a plurality of sub-pixel projection areas, and each of projections of the plurality of TFTs on the first base material falling into a corresponding area of the plurality of sub-pixel projection areas; the recognition circuit layer includes a plurality of photoelectric sensors, projections of the plurality of photoelectric sensors on the first base material falling into a corresponding area of the sub-pixel projection areas, and the photoelectric sensor being configured to sense target lights carrying user fingerprint information.

In an embodiment, the color film substrate includes a second base material and a color resist layer disposed under the second base material, the color resist layer has black matrices with a plurality of light-transmitting holes, the target lights are visible lights, and the photosensitive layers of the plurality of photoelectric sensors are aligned with the plurality of light-transmitting holes respectively.

In an embodiment, the color film substrate includes a second base material and a color resist layer disposed under the second base material, the target lights are visible lights, and the photosensitive layers of the plurality of photoelectric sensors are aligned with color resist blocks of the color resist layer.

In an embodiment, the color film substrate includes a second base material and a color resist layer disposed under the second base material, the target lights are invisible lights, and the photosensitive layers of the plurality of photoelectric sensors are aligned with black matrices of the color resist layer.

In an embodiment, the display screen further includes a gate driver circuit and a data driver circuit, the plurality of gate lines are electrically coupled with the gate driver circuit, and the plurality of data lines are electrically coupled with the data driver circuit; and each of the plurality of photoelectric sensors has one end electrically coupled with the gate driver circuit and the other end electrically coupled with the data driver circuit.

An electronic device is further provided. the electronic device includes a controller and a display screen, and the controller being electrically coupled with the display screen; the display screen includes a color film substrate, a liquid crystal layer, and an array substrate, and the liquid crystal layer being located between the color film substrate and the array substrate; the array substrate includes a first base material, and a display circuit layer and a recognition circuit layer laminated on the first base material; the display circuit layer includes a plurality of gate lines, a plurality of data lines, and a plurality of thin-film transistors (TFT), projections of the plurality of gate lines on the first base material and projections of the plurality of data lines on the first base material defining a plurality of sub-pixel projection areas, and each of projections of the plurality of TFTs on the first base material falling into a corresponding area of the plurality of sub-pixel projection areas; the recognition circuit layer includes a plurality of photoelectric sensors, projections of the plurality of photoelectric sensors on the first base material falling into a corresponding area of the sub-pixel projection areas, and the photoelectric sensor being configured to sense target lights carrying user fingerprint information.

In the following, embodiments of the present disclosure will be elaborated with reference to the accompanying drawings.

FIG. 1 is a schematic structural diagram illustrating an electronic device 1000 according to an embodiment of the present disclosure.

The electronic device 1000 of the present disclosure can be any one of the devices with a communication and storage function, such as a tablet computer, a mobile phone, an e-reader, a remote control, a personal computer (PC), a notebook computer, an in-vehicle device, a web television, a wearable device, and the like.

As illustrated in FIG. 1, the electronic device 1000 includes a display screen 100 and a controller 200. The controller 200 is electrically coupled with the display screen 100. The expression "electrically coupled" referred to herein includes power coupling and signal coupling. The electronic device 1000 further includes a housing 300. The display screen 100 is mounted to the housing 300. The controller 200 is accommodated in the housing 300.

Figure 2:
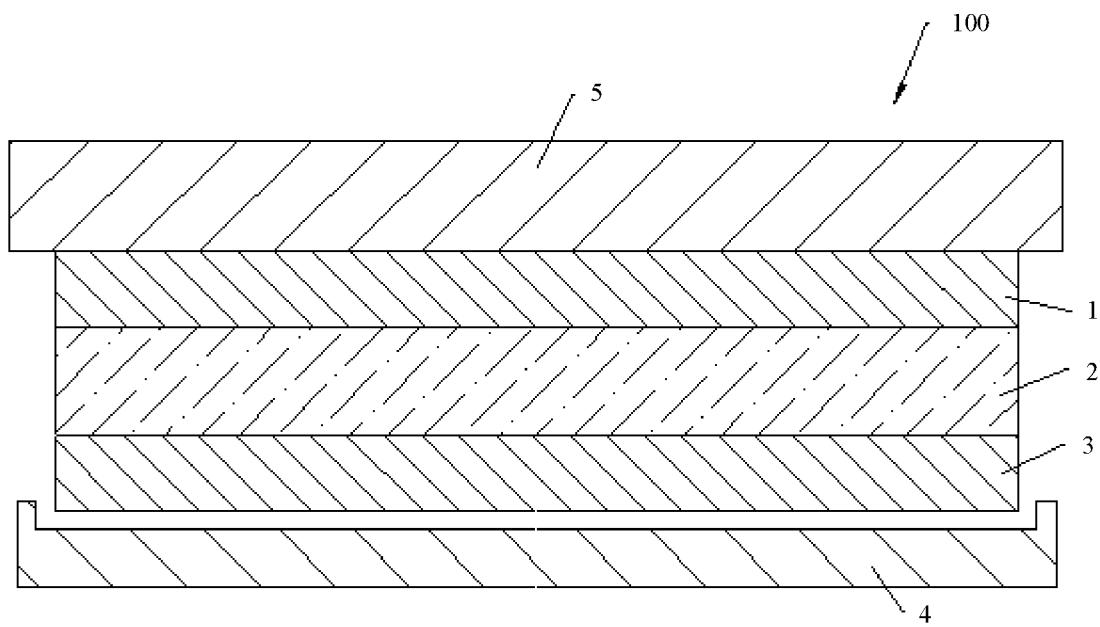
FIG. 2 is a schematic structural diagram illustrating a display screen of the electronic device illustrated of FIG. 1.

FIG. 2 is a schematic structural diagram illustrating the display screen 100 of the electronic device 1000 illustrated in FIG. 1.

As illustrated in FIG. 2, the display screen 100 includes a color film substrate 1, a liquid crystal layer 2, and an array substrate 3. The color film substrate 1 and the array substrate 3 are disposed opposite to each other. The liquid crystal layer 2 is located between the color film substrate 1 and the array substrate 3.

The display screen 100 further includes a backlight module 4. The backlight module 4 is located on one side of the array substrate 3 away from the color film substrate 1. The backlight module 4 is configured to provide backlight.

The display screen 100 further includes a cover plate 5. The cover plate 5 is located on one side of the color film substrate 1 away from the array substrate 3. The cover plate 5 is configured to protect internal components of the display screen 100. The cover plate 5 can be a glass cover plate.

Embodiment 1

Figure 3:
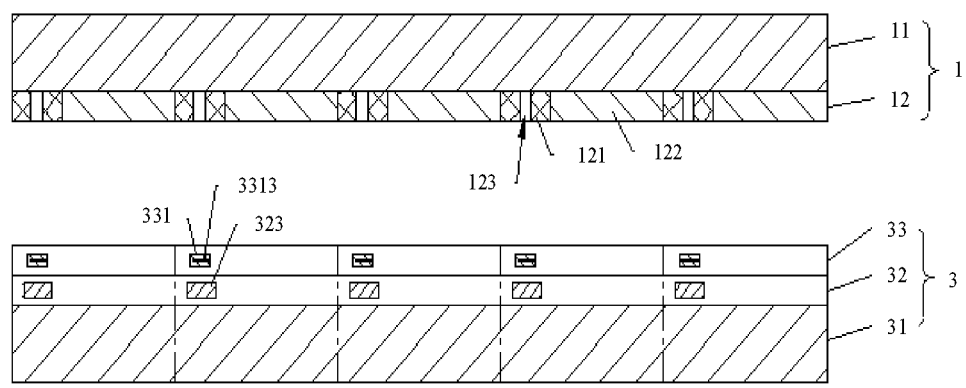
FIG. 3 is a schematic structural diagram illustrating an array substrate and a color film substrate of the display screen of FIG. 2 according to an embodiment of the present disclosure.
Figure 4:
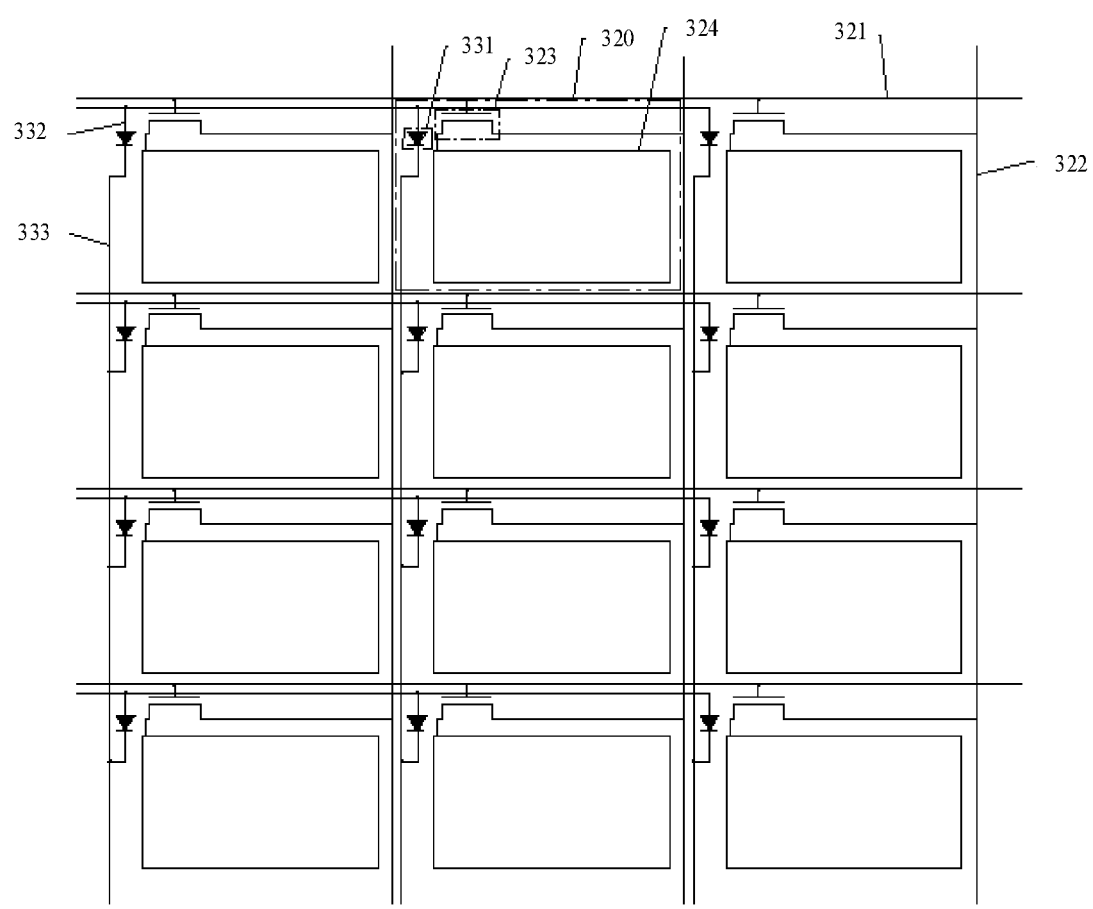
FIG. 4 is a schematic diagram illustrating projections of a display circuit layer and a recognition circuit layer of the array substrate of FIG. 3 on a first base material.
Figure 5:
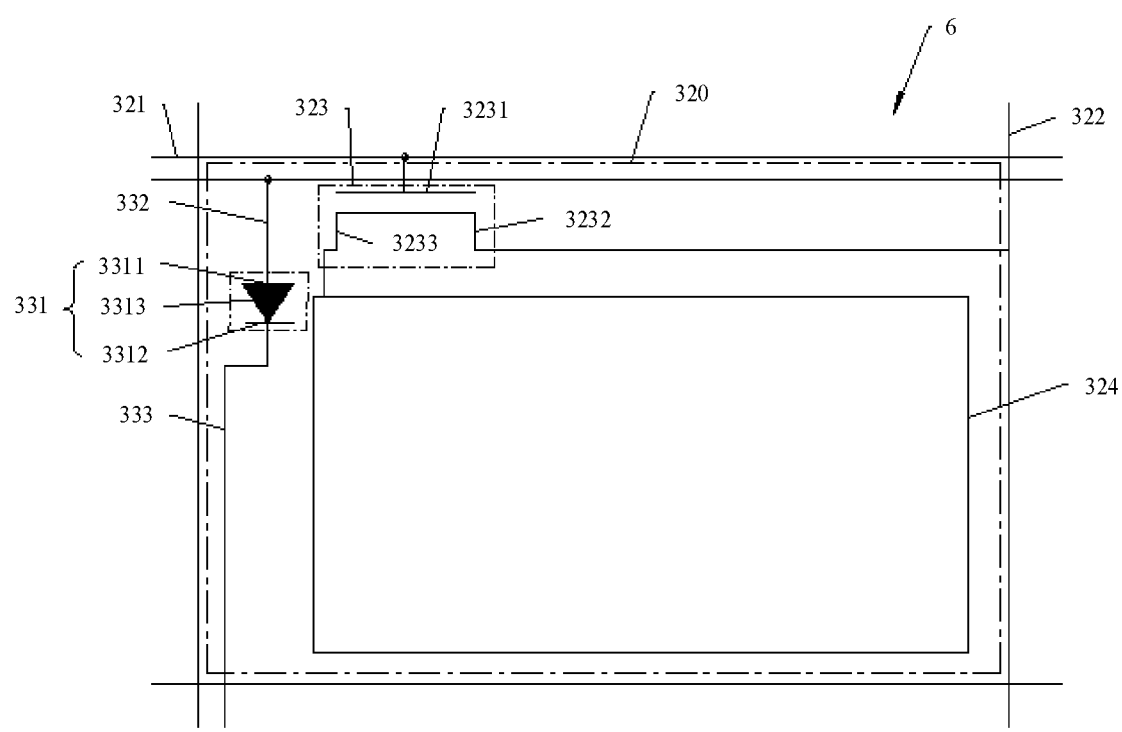
FIG. 5 is a schematic diagram illustrating partial structure of one sub-pixel of FIG. 4.

FIG. 3 is a schematic structural diagram illustrating the array substrate 3 and the color film substrate 1 of the display screen 100 illustrated in FIG. 2 according to Embodiment 1 of the present disclosure, FIG. 4 is a schematic diagram illustrating projections of a display circuit layer 32 and a recognition circuit layer 33 of the array substrate 3 illustrated in FIG. 3 on a first base material 31, and FIG. 5 is a schematic diagram illustrating partial structure of one sub-pixel of FIG. 4.

The array substrate 3 includes the first base material 31, and the display circuit layer 32 and the recognition circuit layer 33 laminated on the first base material 31. The display circuit layer 32 and the recognition circuit layer 33 are laminated on a same side of the array substrate 3.

The display circuit layer 32 includes multiple gate lines 321, multiple data lines 322 and multiple thin-film transistors (TFT) 323. The expression "multiple" referred to herein means "two" or "more than two". The multiple gate lines 321 and the multiple data lines 322 are crossed and insulated from each other. Projections of the multiple gate lines 321 on the first base material 31 and projections of the multiple data lines 322 on the first base material 31 define multiple sub-pixel projection areas 320. The multiple sub-pixel projection areas 320 are arranged in an array. Each of the projections of the multiple TFTs 323 on the first base material 31 falls into a corresponding area of multiple sub-pixel projection areas 320.

The recognition circuit layer 33 includes multiple photoelectric sensors 331. Projections of the multiple photoelectric sensors 331 on the first base material 31 fall into different areas of the sub-pixel projection areas 320. In other words, each of projections of the multiple photoelectric sensors on the first base material falls into a corresponding area of the sub-pixel projection areas. The photoelectric sensor 331 is configured to sense target lights carrying user fingerprint information. Backlight can become the target lights after being reflected by a finger of a user. Since reflections of valleys (that is, fingerprint valleys) are different from reflections of ridges (that is, fingerprint ridges) in a fingerprint pattern, a fingerprint pattern of the finger of the user can be obtained by analyzing the distribution and light intensities of the target lights, from this point of view, the target lights carry user fingerprint information. When the photoelectric sensor 331 senses lights of different light intensities, photoelectric effect occurs and currents of different magnitudes are produced. Therefore, when the photoelectric sensor 331 senses the target lights, electrical signals corresponding to the target lights can be generated. The controller 200 can obtain a corresponding fingerprint image by analyzing the electrical signals, to conduct fingerprint identification.

In the present disclosure, part of the array substrate 3, part of the liquid crystal layer 2, and part of the color film substrate 1 which have projections on the first base material 31 falling into a same sub-pixel projection area 320 form a sub-pixel 6. Multiple sub-pixels 6 are located in a display area of the display screen 100. The sub-pixel 6 can be configured to display pictures. Multiple sub-pixels 6 constitute one pixel unit. For example, one pixel unit includes three sub-pixels 6, and the three sub-pixels 6 are respectively configured to display red (R) pictures, green (G) pictures, and blue (B) pictures. Still another example, one pixel unit includes four sub-pixels 6, and the four sub-pixels 6 are respectively configured to display red (R) pictures, green (G) pictures, blue (B) pictures, and white (W) pictures. Still another example, the four sub-pixels 6 are respectively configured to display red (R) pictures, green (G) pictures, blue (B) pictures, and yellow (Y) pictures.

Each of the multiple sub-pixels 6 has a TFT 323. The TFT 323 has a gate 3231 coupled with a corresponding gate line 321. The TFT 323 has one end (source or drain) 3232 coupled with a corresponding data line 322. Some of the multiple sub-pixels 6 have photoelectric sensors 331, and the photoelectric sensors 331 in these sub-pixels 6 have projections on the first base material 31 falling into corresponding sub-pixel projection areas 320. In an embodiment, the whole display area of the display screen 100 is able to sense fingerprints, and the position where fingerprint is sensed is not restricted. In other embodiments, only one or some blocks of the display area of the display screen 100 are able to sense fingerprints.

In the embodiment, since the projections of the multiple photoelectric sensors 331 on the first base material 31 fall into the multiple sub-pixel projection areas 320, the multiple photoelectric sensors 331 are integrated into the multiple sub-pixels 6, and the multiple sub-pixels 6 are located in the display area of the display screen 100, a fingerprint identification module composed of the multiple photoelectric sensors 331 can be disposed in the display area without occupying space of a non-display area of the display screen 100. As such, compared with the conventional display screen, the non-display area of the display screen 100 can be decreased compared with a conventional display screen, and the display area of the display screen 100 can be increased, thereby increasing a screen-to-body ratio of the display screen 100 and a screen-to-body ratio of the electronic device 1000 with the display screen 100. In the present disclosure, the display screen 100 and the electronic device 1000 have a high screen-to-body ratio and are even able to support full-screen display.

In the embodiment, since the multiple photoelectric sensors 331 are integrated into the multiple sub-pixels 6 of the display screen 100, it is unnecessary to have an extra structural design for the fingerprint identification module of the electronic device 1000, which makes it easier to achieve complete machine assembly of the electronic device 1000.

In other embodiments, backlight can also become the target lights after being reflected by a palm or an iris of the user. In this case, the multiple photoelectric sensors are configured to sense a palm pattern ("palm image" for short) or an iris pattern ("iris image" for short) of the user, to enable the electronic device to obtain an image of the palm pattern or an image of the iris pattern, thereby achieving palmprint identification or iris identification.

The display circuit layer 32 further includes multiple pixel electrodes 324. In an embodiment, the color film substrate 1 has a common electrode (not illustrated). The common electrode, the liquid crystal layer 2, and the multiple pixel electrodes 324 form a pixel capacitor of the display screen 100. In another embodiment, the display circuit layer 32 further includes a common electrode (not illustrated). The display screen 100 achieves liquid crystal deflection through an in-plane switching (IPS) technology.

The recognition circuit layer 33 further includes multiple input wires 332. Each of the multiple input wires 332 is coupled with a corresponding one of anodes 3311 of the multiple photoelectric sensors 331. The recognition circuit layer 33 further includes multiple output wires 333. Each of the multiple output wires 333 is coupled with a corresponding one of cathodes 3312 of the multiple photoelectric sensors 331.

In the present disclosure, the target lights sensed by the photoelectric sensor 331 can be visible lights or invisible lights. Photoelectric effect occurs when a photosensitive layer 3313 of the photoelectric sensor 331 receives the target lights.

In an embodiment, the target lights are visible lights. Photoelectric effect occurs when the photosensitive layer 3313 of the photoelectric sensor 331 senses the visible lights. For example, the photosensitive layer 3313 of the photoelectric sensor 331 can be made of a silicon compound, which includes but is not limited to SiOx, SiNy, SiOxNy, and the like. In this case, backlight emitted by the backlight module 4 is visible light.

In another embodiment, the target lights are invisible lights. Photoelectric effect occurs when the photosensitive layer 3313 of the photoelectric sensor 331 senses the invisible lights. For example, the target lights can be infrared lights, near-infrared lights, ultraviolet lights, or near-ultraviolet lights. The photosensitive layer 3313 of the photoelectric sensor 331 can be made of a material such as PbS or the like that is sensitive to infrared rays or near-infrared rays, or can be made of a material such as ITZO, IGZO, or the like that is sensitive to ultraviolet rays or near-ultraviolet rays. In this case, backlight emitted by the backlight module 4 includes visible lights and invisible lights.

Figure 6:
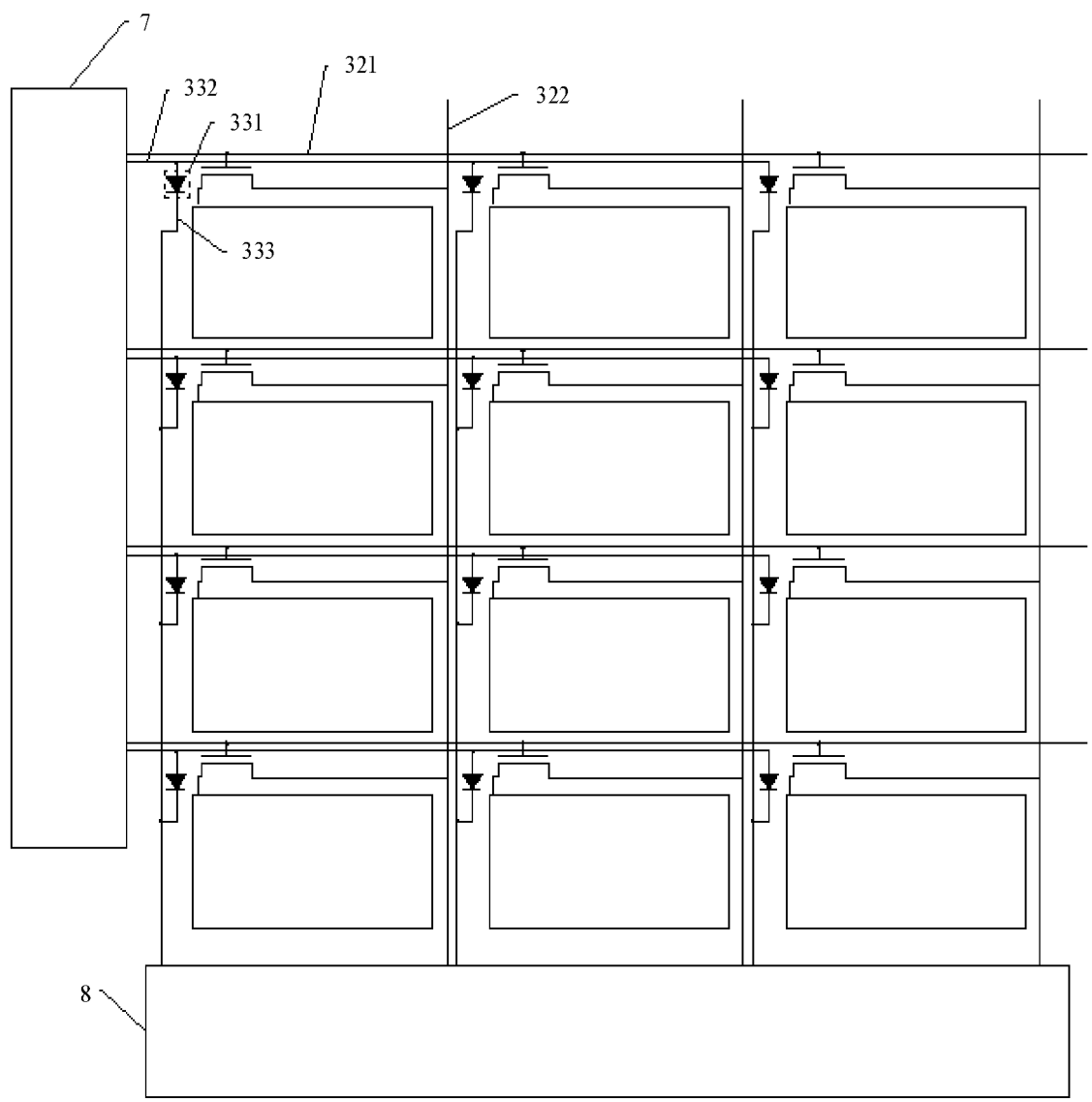
FIG. 6 is a schematic diagram illustrating partial circuit of the display screen of FIG. 2 according to an embodiment of the present disclosure.

FIG. 6 is a schematic diagram illustrating part of a circuit of the display screen 100 illustrated in FIG. 2 according to an embodiment of the present disclosure.

As illustrated in FIG. 6, the display screen 100 further includes a gate driver circuit 7 and a data driver circuit 8. The controller 200 is electrically coupled with the gate driver circuit 7 and the data driver circuit 8. The multiple gate lines 321 are electrically coupled with the gate driver circuit 7. The multiple data lines 322 are electrically coupled with the data driver circuit 8. Each of the multiple photoelectric sensors 331 has one end electrically coupled with the gate driver circuit 7 and the other end electrically coupled with the data driver circuit 8. For each of the multiple photoelectric sensors 331, "the one end" is the anode 3311, and "the other end" is the cathode 3312.

The gate driver circuit 7 includes a first display driver module and a first recognition driver module. The first display driver module is coupled with the multiple gate lines 321 and is configured to be involved in display of the display screen 100. The first recognition driver module is coupled with the multiple photoelectric sensors 331 and is configured to be involved in fingerprint identification of the display screen 100. The data driver circuit 8 includes a second display driver module and a second recognition driver module. The second display driver module is coupled with the multiple data lines 322 and is configured to be involved in display of the display screen 100. The second recognition driver module is coupled with the multiple photoelectric sensors 331 and is configured to be involved in fingerprint identification of the display screen 100.

In the embodiment, since the multiple photoelectric sensors 331 multiplex the gate driver circuit 7 and the data driver circuit 8 as its driver circuit, types of materials for manufacturing the display screen 100 are decreased, and a procedure of assembly of the display screen 100 is simplified.

The anodes 3311 of the multiple photoelectric sensors 331 are coupled to the gate driver circuit 7 via the multiple input wires 332 respectively. When fingerprint identification is needed, the multiple photoelectric sensors 331 can be enabled (that is, switched on) one after another, or be enabled simultaneously. In other embodiments, the anodes 3311 of the multiple photoelectric sensors 331 are gathered into a bus and then coupled to the gate driver circuit 7 as a whole. The cathodes 3312 of the multiple photoelectric sensors 331 are coupled to the data driver circuit 8 via the multiple output wires 333 respectively.

In other embodiments, different from the foregoing embodiment, the anodes 3311 of the multiple photoelectric sensors 331 are coupled to the data driver circuit 8. The cathodes 3312 of the multiple photoelectric sensors 331 are coupled to the gate driver circuit 7.

In the present disclosure, pulse signals can be applied to the anodes 3311 of the multiple photoelectric sensors 331. As such, variation of the target lights is obtained by analyzing variation in pulse amplitudes of electrical signals output by the cathodes 3312 of the multiple photoelectric sensors 331, thereby forming a fingerprint image of the user.

Figure 7:
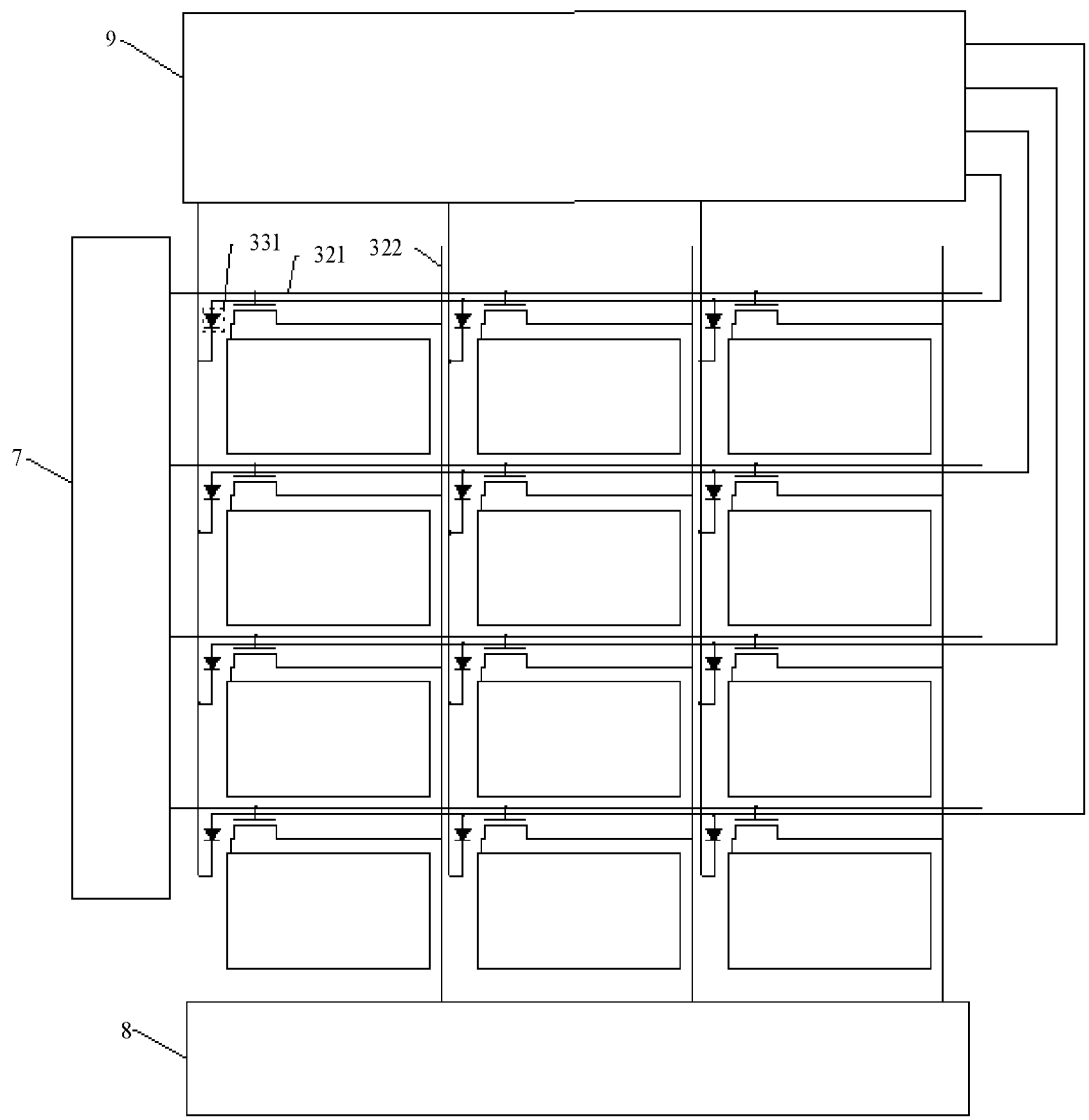
FIG. 7 is a schematic diagram illustrating partial circuit of the display screen of FIG. 2 according to another embodiment of the present disclosure.

FIG. 7 is a schematic diagram illustrating part of a circuit of the display screen 100 illustrated in FIG. 2 according to another embodiment of the present disclosure.

As illustrated in FIG. 7, different from the foregoing embodiment, the display screen 100 further includes a sensor driver circuit 9, that is, the display screen 100 further includes the gate driver circuit 7, the data driver circuit 8, and the sensor driver circuit 9. The multiple gate lines 321 are electrically coupled with the gate driver circuit 7. The multiple data lines 322 are electrically coupled with the data driver circuit 8. The multiple photoelectric sensors 331 are electrically coupled with the sensor driver circuit 9. The sensor driver circuit 9 is electrically coupled with the controller 200.

In this embodiment, since the display screen 100 has an independent sensor driver circuit 9, the gate driver circuit 7 and the data driver circuit 8 can be designed in a traditional manner. In addition, the display circuit layer 32 and the recognition circuit layer 33 can both work independently, which diversifies the manner in which the display screen 100 works.

As illustrated in FIG. 3, the target lights are visible lights, and the display circuit layer 32 is located between the first base material 31 and the recognition circuit layer 33. As such, the recognition circuit layer 33 is closer to the finger of the user, which makes the multiple photoelectric sensors 331 closer to the finger of the user, thereby improving quality of imaging of a fingerprint image and thus achieving higher accuracy of identification. At the same time, the multiple photoelectric sensors 331 will not be occluded by wires and components of the display circuit layer 32. Therefore, the arrangement of the wires and components of the display circuit layer 32 will be more flexible.

The projections of the multiple photoelectric sensors 331 on the first base material 31 and the projections of the multiple TFTs 323 on the first base material 31 are partially overlapped. In this case, the multiple photoelectric sensors 331 and the multiple TFTs 323 are substantially overlapped. The multiple photoelectric sensors 331 and the multiple TFTs 323 can multiplex space of the array substrate 3 vertically and horizontally, thereby increasing an aperture ratio of the display screen 100.

The color film substrate 1 includes a second base material 11 and a color resist layer 12 disposed under the second base material 11. The color resist layer 12 includes black matrices 121 and color resist blocks 122. The black matrices 121 of the color resist layer 12 has multiple light-transmitting holes 123. The photosensitive layers 3313 of the multiple photoelectric sensors 331 are aligned with the multiple light-transmitting holes 123 respectively.

In this embodiment, the target lights can pass through the multiple light-transmitting holes 123 to enter the photosensitive layers 3313 of the multiple photoelectric sensors 331, to enable the multiple photoelectric sensors 331 to sense the target lights. The multiple photoelectric sensors 331 are located under the black matrices 121, such that the multiple photoelectric sensors 331 will not form light-shielding blocks within areas corresponding to the color resist blocks 122, thereby increasing the aperture ratio of the display screen 100.

Figure 8:
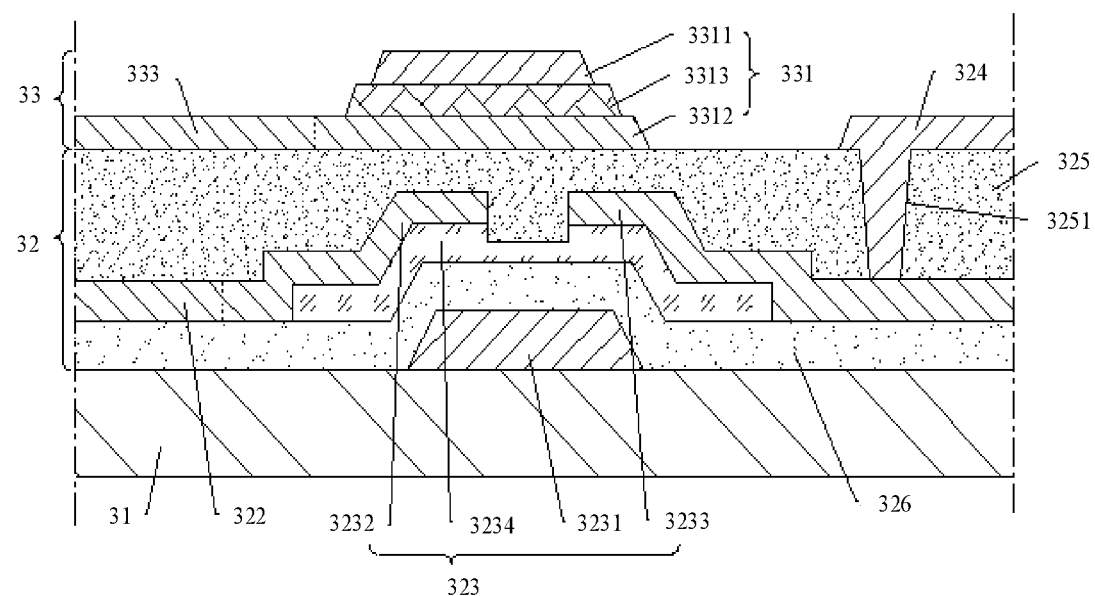
FIG. 8 is a schematic structural diagram illustrating partial structure of the array substrate of FIG. 3 according to an embodiment of the present disclosure.

FIG. 8 is a schematic structural diagram illustrating partial structure of the array substrate 3 illustrated in FIG. 3 according to an embodiment of the present disclosure. FIG. 8 mainly illustrates a structure of one TFT 323, a structure of one photoelectric sensor 331, and a structure of one pixel electrode 324.

Each of the multiple photoelectric sensors 331 includes the cathode 3312, the photosensitive layer 3313, and the anode 3311 sequentially laminated. The cathode 3312 is located on one side of the photosensitive layer 3313 towards the first base material 31. The anode 3311 is located on one side of the photosensitive layer 3313 away from the cathode 3312. The cathode 3312 of the photoelectric sensor 331 is in contact with one surface of the photosensitive layer 3313 of the photoelectric sensor 331, and the anode 3311 of the photoelectric sensor 331 is in contact with the other surface of the photosensitive layer 3313 of the photoelectric sensor 331. The anode 3311 is made of a transparent conductive material. The transparent conductive material can be but is not limited to Indium tin oxide (ITO).

In this embodiment, since the anode 3311 is made of a transparent conductive material, the target lights can pass through the anode 3311 to enter the photosensitive layer 3313, to enable the photoelectric sensor 331 to sense the target lights.

The cathode 3312 is made of a light-shielding conductive material. The light-shielding conductive material includes but is not limited to metal such as copper. A projection of the cathode 3312 on the first base material 31 covers a projection of the photosensitive layer 3313 on the first base material 31. The cathode 3312 of the photoelectric sensor 331 can be taken as a light-shielding layer configured to shield backlight emitted by the backlight module 4, to avoid interference of backlight with sensing of the photoelectric sensor 331.

As illustrated in FIG. 4 and FIG. 8, the recognition circuit layer 33 further includes multiple output wires 333. The multiple output wires 333 are respectively coupled with the cathodes 3312 of the multiple photoelectric sensors 331. The multiple output wires 333 are configured to transmit electrical signals generated by the multiple photoelectric sensors 331 to a corresponding driver circuit.

The multiple output wires 333 and the cathodes 3312 of the multiple photoelectric sensors 331 are disposed on the same layer and made of the same material. The multiple output wires 333 and the cathodes 3312 of the multiple photoelectric sensors 331 can be patterned through a same etching process, which is possible to simplify a manufacturing procedure of the array substrate 3 and thus reduce cost of producing the array substrate 3.

In this embodiment, projections of the multiple output wires 333 on the first base material 31 and the projections of the multiple data lines 322 on the first base material 31 are partially overlapped. As such, the multiple output wires 333 and the multiple data lines 322 multiplex some space of the length and some space of the width of the array substrate 3, which is beneficial to increasing an aperture ratio of the display screen 100.

In other embodiments, the projections of the multiple output wires 333 on the first base material 31 and the projections of the multiple gate lines 321 on the first base material 31 are partially overlapped. As such, the multiple output wires 333 and the multiple gate lines 321 multiplex some space of the length and some space of the width of the array substrate 3, which is beneficial to increasing the aperture ratio of the display screen 100.

As illustrated in FIG. 4 and FIG. 8, the array substrate 3 further includes the multiple pixel electrodes 324. Each of projections of the multiple pixel electrodes 324 on the first base material 31 falls into a corresponding area of the multiple sub-pixel projection areas 320. Each of the multiple pixel electrodes 324 is electrically coupled with a corresponding one of the multiple TFTs 323.

That is to say, a gate 3231 (G, also referred to as gate pole) of each of the multiple TFTs 323 is coupled to the gate line 321. The TFT 323 has a first end 3232 coupled with the data line 322 and a second end 3233 coupled with the pixel electrode 324. The first end 3232 of the TFT 323 is coupled with one end of a semiconductor layer 3234, and the second end 3233 of the TFT 323 is coupled with the other end of the semiconductor layer 3234.

In an embodiment, the first end 3232 of the TFT 323 is a source (S), and the second end 3233 of the TFT 323 is a drain (D). In another embodiment, the first end 3232 of the TFT 323 is a drain, and the second end 3233 of the TFT 323 is a source.

The multiple pixel electrodes 324 and the anodes 3311 of the multiple photoelectric sensors 331 are disposed on the same layer. The multiple pixel electrodes 324 and the anodes 3311 of the multiple photoelectric sensors 331 are made of the same material. The multiple pixel electrodes 324 and the multiple photoelectric sensors 331 can be patterned through a same etching process, thereby simplifying a manufacturing procedure of the array substrate 3 and thus reducing cost of producing the array substrate 3.

The display circuit layer 32 further includes a first planarization layer 325. The first planarization layer 325 is located on one side of the multiple TFTs 323 away from the first base material 31. The first planarization layer 325 covers the multiple TFTs 323 and the multiple data lines 322. The first planarization layer 325 is made of an insulation material. The first planarization layer 325 can provide a good moulding surface to the recognition circuit layer 33, thereby increasing a product yield of the recognition circuit layer 33.

The first planarization layer 325 has multiple first through-holes 3251. The multiple first through-holes 3251 are aligned with the multiple TFTs 323 (that is, the second ends 3233 of the multiple TFTs 323) respectively. The cathodes 3312, the photosensitive layers 3313, and the anodes 3311 of the multiple photoelectric sensors 331 are sequentially laminated on one side of the first planarization layer 325 away from the first base material 31. The cathodes 3312 are isolated from the anodes 3311 by the photosensitive layers 3313. The multiple pixel electrodes 324 are located on the one side of the first planarization layer 325 away from the first base material 31. The multiple pixel electrodes 324 are coupled to the multiple TFTs 323 through the multiple first through-holes 3251 respectively.

The display circuit layer 32 further includes a gate insulation layer 326 covering the gate 3231 of the TFT 323. The gate insulation layer 326 isolates the gate 3231 from the semiconductor layer 3234 of the TFT 323, and covers the gate 3231 and the semiconductor layer 3234 of the TFT 323.

Figure 9:
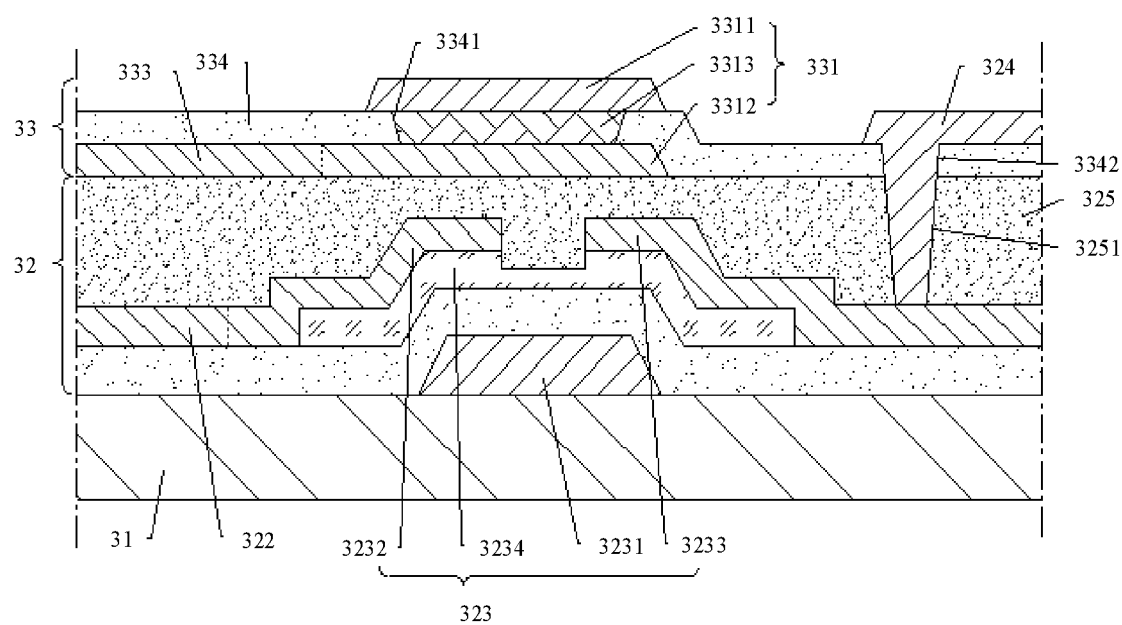
FIG. 9 is a schematic structural diagram illustrating partial structure of the array substrate of FIG. 3 according to another embodiment of the present disclosure.

FIG. 9 is a schematic structural diagram illustrating partial structure of the array substrate 3 illustrated in FIG. 3 according to another embodiment of the present disclosure. As illustrated in FIG. 9, FIG. 9 mainly illustrates a structure of one TFT 323, a structure of one photoelectric sensor 331, and a structure of one pixel electrode 324.

The main difference between the array substrate 3 illustrated in FIG. 9 and the array substrate 3 illustrated in FIG. 8 lies in the following.

The recognition circuit layer 33 further includes an insulation layer 334.

The cathodes 3312 of the multiple photoelectric sensors 331 are located on one side of the first planarization layer 325 away from the first base material 31. For example, the cathodes 3312 of the multiple photoelectric sensors 331 are located on a surface of the first planarization layer 325 away from the first base material 31.

The insulation layer 334 is located on the one side of the first planarization layer 325 away from the first base material 31 and covers the cathodes 3312 of the multiple photoelectric sensors 331. The insulation layer 334 has multiple second through-holes 3341 and multiple third through-holes 3342. The multiple second through-holes 3341 are aligned with the cathodes 3312 of the multiple photoelectric sensors respectively. The multiple third through-holes 3342 communicate with the multiple first through-holes 3251 respectively.

The photosensitive layers 3313 of the multiple photoelectric sensors 331 are partially or wholly filled in the multiple second through-holes 3341 respectively, to be in contact with the cathodes 3312 of the multiple photoelectric sensors 331.

The anodes 3311 of the multiple photoelectric sensors 331 are located on one side of the insulation layer 334 away from the first planarization layer 325 and covers the photosensitive layers 3313 of the multiple photoelectric sensors 331 respectively. The anodes 3311 of the multiple photoelectric sensors 331 are isolated from the cathodes 3312 of the multiple photoelectric sensors 331 by the photosensitive layers 3313 of the multiple photoelectric sensors 331 and the insulation layer 334.

The pixel electrodes 324 are located on the one side of the insulation layer 334 away from the first planarization layer 325 and are coupled to the multiple TFTs 323 via the multiple third through-holes 3342 and the multiple first through-holes 3251 respectively.

Embodiment 2

Figure 10:
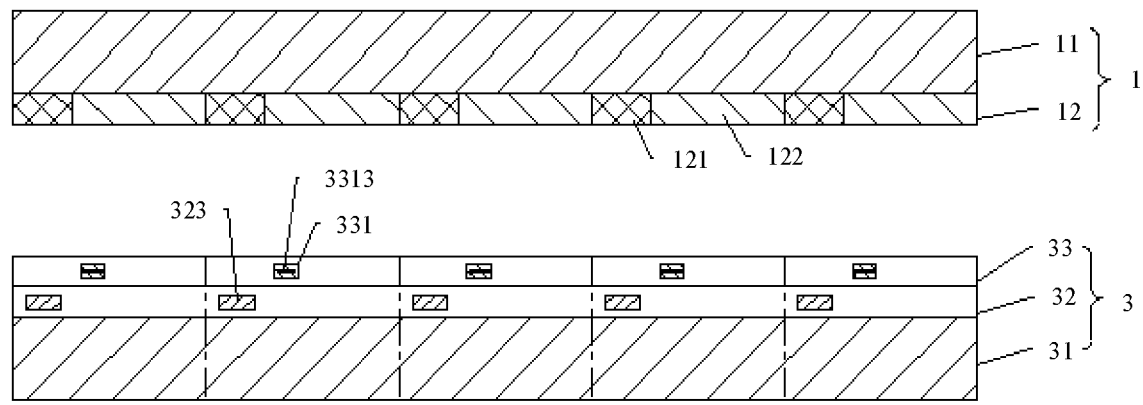
FIG. 10 is a schematic structural diagram illustrating an array substrate and a color film substrate of the display screen of FIG. 2 according to another embodiment of the present disclosure.

FIG. 10 is a schematic structural diagram illustrating the array substrate 3 and the color film substrate 1 of the display screen 100 illustrated in FIG. 2 according to Embodiment 2 of the present disclosure. For details of the structure of a circuit of the array substrate 3 of Embodiment 2, reference can be made to Embodiment 1 (FIGS. 4 to 7).

As illustrated in FIG. 10, The main difference between Embodiment 2 and Embodiment 1 lies in the following.

The target lights are visible lights. Projections of photosensitive layers 3313 of the multiple photoelectric sensors 331 on the first base material 31 and the projections of the multiple TFTs 323 on the first base material 31 are misaligned. In a same sub-pixel projection area 320, positions of the photoelectric sensor 331 and the TFT 323 can be set flexibly. As an embodiment, the projection of the photoelectric sensor 331 on the first base material 31 occupies one of the four corners of the sub-pixel projection area 320, and the projection of the TFT 323 on the first base material 31 occupies another one of the four corners of the sub-pixel projection area 320. For example, the projection of the TFT 323 on the first base material 31 is located on the bottom left, and the projection of the photoelectric sensor 331 on the first base material 31 is located on the top left, the top right, or the bottom right.

The color film substrate 1 includes a second base material 11 and a color resist layer 12 disposed under the second base material 11. The color resist layer 12 includes black matrices 121 and color resist blocks 122. The photosensitive layers 3313 of the multiple photoelectric sensors 331 are aligned with the color resist blocks 122 of the color resist layer 12. The target lights can pass though the second base material 11 and the color resist blocks 122 to enter the multiple photoelectric sensors 331. The multiple TFTs 323 are aligned with the black matrices 121 of the color resist layer 12. The black matrices 121 occludes the multiple TFTs 323.

The display circuit layer 32 is located between the first base material 31 and the recognition circuit layer 33. As such, the recognition circuit layer 33 is closer to the finger of the user, such that the multiple photoelectric sensors 331 are closer to the finger of the user, thereby improving quality of imaging of a fingerprint image and thus achieving higher accuracy of identification. Meanwhile, the multiple photoelectric sensors 331 will not be occluded by lines and components of the display circuit layer 32, such that arrangement of the lines and components of the display circuit layer 32 will be more flexible.

Embodiment 3

Figure 11:
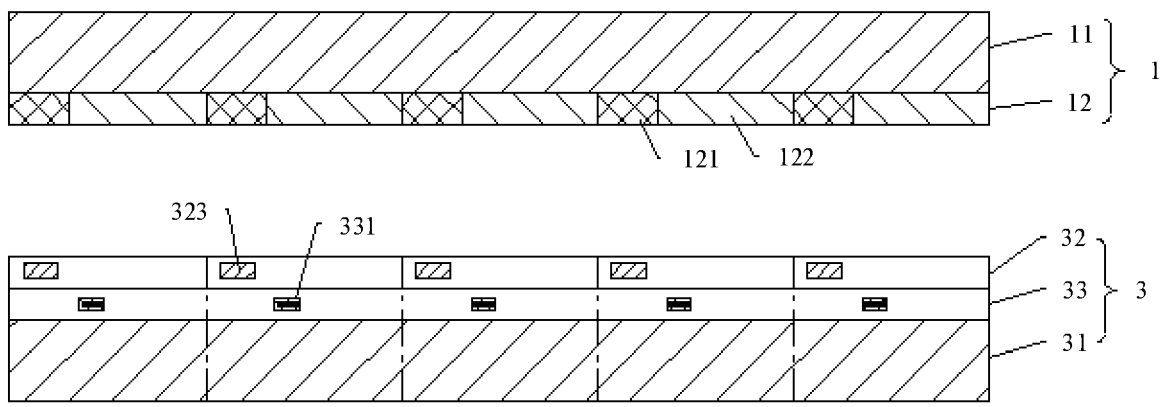
FIG. 11 is a schematic structural diagram illustrating an array substrate and a color film substrate of the display screen of FIG. 2 according to another embodiment of the present disclosure.
Figure 12:
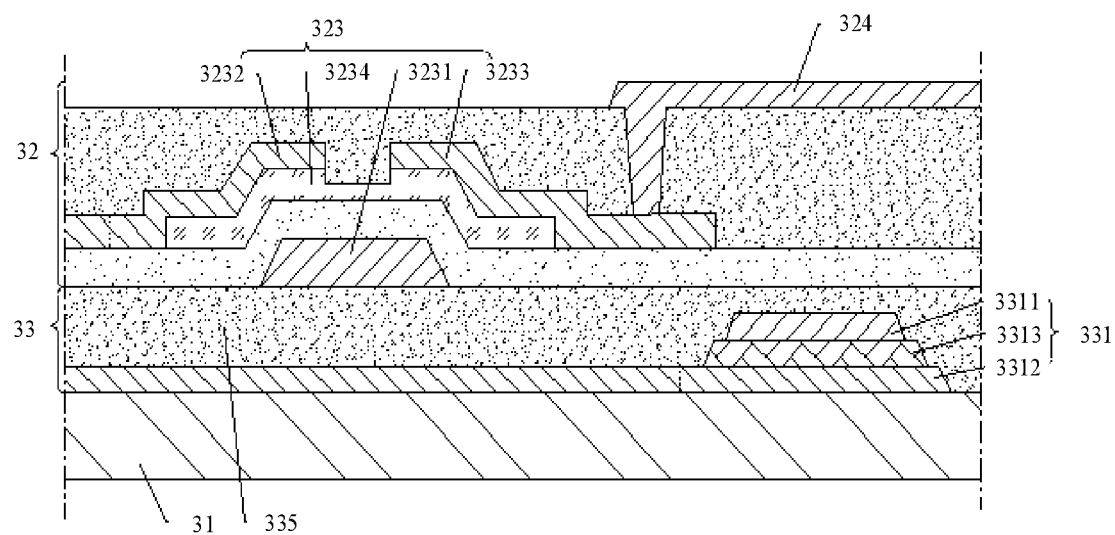
FIG. 12 is a schematic structural diagram illustrating partial structure of the array substrate of FIG. 11.

FIG. 11 is a schematic structural diagram illustrating the array substrate 3 and the color film substrate 1 of the display screen 100 illustrated in FIG. 2 according to Embodiment 3 of the present disclosure. FIG. 12 is a schematic structural diagram illustrating partial structure of the array substrate 3 illustrated in FIG. 11. FIG. 12 mainly illustrates a structure of one TFT 323, a structure of one photoelectric sensor 331, and a structure of one pixel electrode 324. For details of the structure of a circuit of the array substrate 3 of Embodiment 3, reference can be made to Embodiment 1 (FIGS. 4 to 7).

As illustrated in FIG. 11 and FIG. 12, The main difference between Embodiment 3 and Embodiment 2 lies in that the recognition circuit layer 33 is located between the first base material 31 and the display circuit layer 32.

In this embodiment, the multiple pixel electrodes 324 and the anode 3311 of the multiple photoelectric sensors 331 are not disposed on the same layer. The multiple pixel electrodes 324 can be disposed on one side of the display circuit layer 32 away from the recognition circuit layer 33.

The recognition circuit layer 33 further includes a second planarization layer 335. The second planarization layer 335 is located on one side of the multiple photoelectric sensors 331 away from the first base material 31. The second planarization layer 335 covers the multiple photoelectric sensors 331. The second planarization layer 335 is made of an insulation material. The second planarization layer 335 can provide a good moulding surface to the display circuit layer 32, thereby increasing a product yield of the display circuit layer 32.

Embodiment 4

Figure 13:
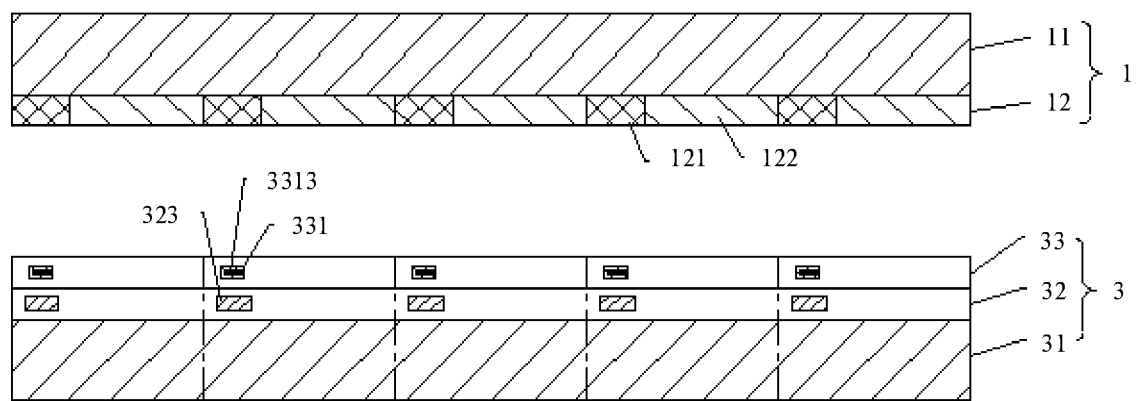
FIG. 13 is a schematic structural diagram illustrating an array substrate and a color film substrate of the display screen of FIG. 2 according to another embodiment of the present disclosure.
Figure 14:
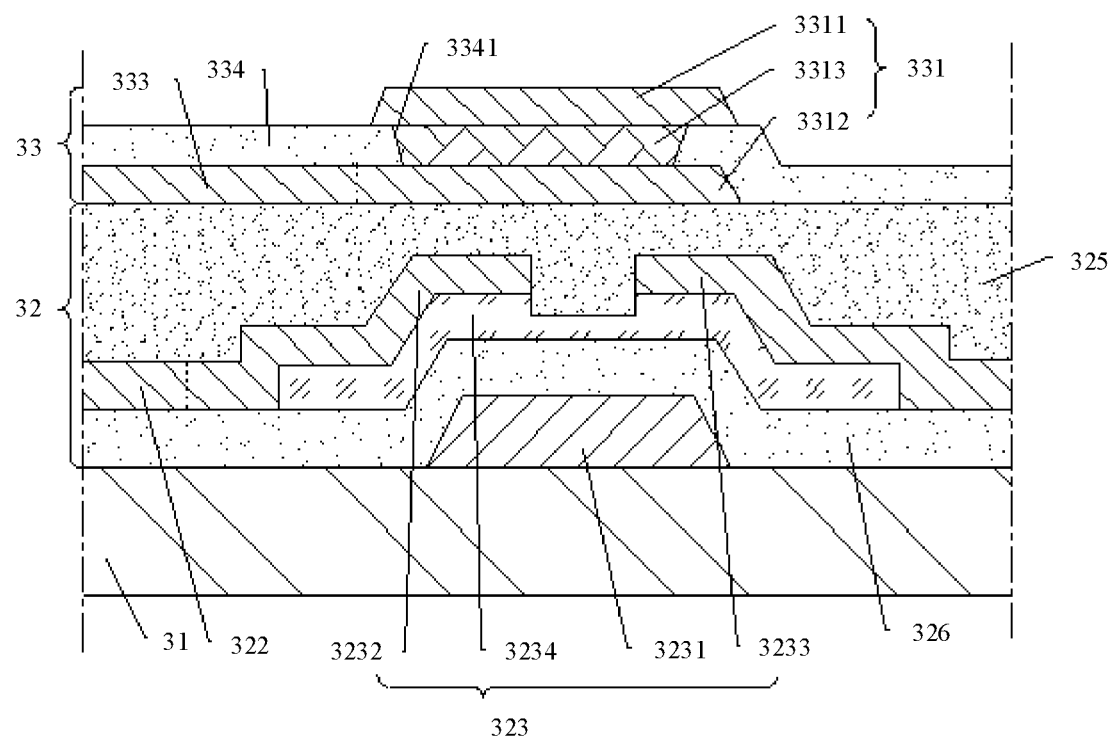
FIG. 14 is a schematic structural diagram illustrating partial structure of the array substrate of FIG. 13.

FIG. 13 is a schematic structural diagram illustrating the array substrate 3 and the color film substrate 1 of the display screen 100 illustrated in FIG. 2 according to Embodiment 4 of the present disclosure. FIG. 14 is a schematic structural diagram illustrating partial structure of the array substrate 3 illustrated in FIG. 13. FIG. 14 mainly illustrates a structure of one TFT 323 and a structure of one photoelectric sensor 331. For details of the structure of a circuit of the array substrate 3 of Embodiment 4, reference can be made to Embodiment 1 (FIGS. 4 to 7).

As illustrated in FIG. 13 and FIG. 14, The main difference between Embodiment 4 and Embodiments 1 to 3 lies in the following.

The target lights are invisible lights. The projections of the multiple photoelectric sensors 331 on the first base material 31 and the projections of the multiple TFTs 323 on the first base material 31 are partially overlapped.

The color film substrate 1 includes a second base material 11 and a color resistance layer 12 disposed under the second base material 11. The color resistance layer 12 includes black matrices 121 and color resist blocks 122. The black matrices 121 allow lights with wavelengths at special frequency bands, such as infrared lights, ultraviolet lights, etc., to pass through.

The photosensitive layers 3313 of the multiple photoelectric sensors 331 are aligned with the black matrices 121 of the color resist layer 12. The multiple TFTs 323 are aligned with the black matrices 121 of the color resist layer 12. The target lights can pass through the black matrices 121 to enter the multiple photoelectric sensors 331. The black matrices 121 occlude the multiple photoelectric sensors 331 and the multiple TFTs 323.

As illustrated in FIG. 5 and FIG. 14, the display circuit layer 32 is located between the first base material 31 and the recognition circuit layer 33.

The display circuit layer 32 includes the gate 3231 of the TFT 323, the gate insulation layer 326, the semiconductor layer 3234 of the TFT 323, the first end 3232 of the TFT 323, the second end 3233 of the TFT 323, and the first planarization layer 325. The display circuit layer 32 further includes the data line 322 coupled with the first end 3232 of the TFT 323 and the gate line 321 (not illustrated in FIG. 14) coupled with the gate 3231 of the TFT 323.

The recognition circuit layer 33 includes the cathode 3312 of the photoelectric sensor 331, the photosensitive layer 3313 of the photoelectric sensor 331, and the anode 3311 of the photoelectric sensor 331. The recognition circuit layer 33 further includes the multiple output wires 333. The multiple output wires 333 are coupled with the cathodes 3312 of the multiple photoelectric sensors 331 respectively. The display circuit layer 32 further includes the multiple input wires 332 (not illustrated in FIG. 14). The multiple input wires 332 are coupled with the anodes 3311 of the multiple photoelectric sensors 331 respectively.

The multiple output wires 333 and the cathodes 3312 of the multiple photoelectric sensors 331 are disposed on the same layer and made of the same material. The multiple output wires 333 and the cathodes 3312 of the multiple photoelectric sensors 331 can be patterned through a same etching process, to simplify a manufacturing procedure of the array substrate 3 and thus reduce cost of producing the array substrate 3.

Projections of the multiple output wires 333 on the first base material 31 are partially overlapped with the projections of the multiple gate lines 321 on the first base material 31 (or the projections of the multiple data lines 322 on the first base material 31). In this case, the multiple gate lines 321 (or the multiple data lines 322) and the multiple output wires 333 multiplex space of the array substrate 3 vertically and horizontally, which is beneficial to improving an aperture ratio of the display screen 100. In the present disclosure, partial overlap between the projections of the multiple output wires 333 on the first base material 31 and the projections of the multiple data lines 322 on the first base material 31 is taken as an example for illustration.

The multiple input wires 332 and the anodes 3311 of the multiple photoelectric sensors 331 are disposed on the same layer and made of the same material. The multiple input wires 332 and the anodes 3311 of the multiple photoelectric sensors 331 can be patterned through a same etching process, which simplifies a manufacturing procedure of the array substrate 3 and thus reduces cost of producing the array substrate 3.

The multiple input wires 332 and the multiple output wires 333 are made of the same material. As such, the number of types of materials can be prepared with few types of materials, which is beneficial to reducing cost of the array substrate 3.

Corresponding to those described with reference to the multiple output wires 333, the projections of the multiple input wires 332 on the first base material 31 are partially overlapped with the projections of the multiple data lines 322 on the first base material 31 (or the projections of the multiple gate lines 321 on the first base material 31). In this case, the multiple data lines 322 (or the multiple gate lines 321) and the multiple input wires 332 multiplex space of the array substrate 3 vertically and horizontally, which is beneficial to improving the aperture ratio of the display screen 100. In the present disclosure, partial overlap between the projections of the multiple input wires 332 on the first base material 31 and the projections of the multiple gate lines 321 on the first base material 31 is taken as an example for illustration.

Embodiment 5

Figure 15:
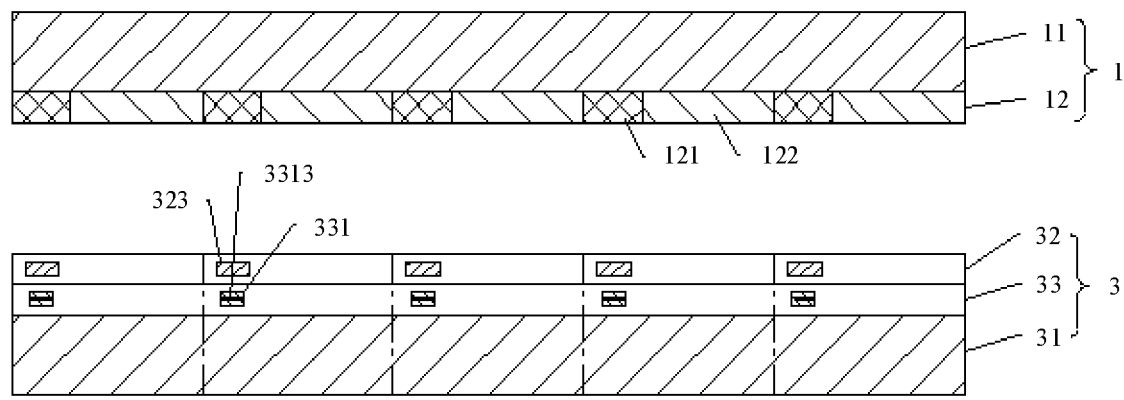
FIG. 15 is a schematic structural diagram illustrating an array substrate and a color film substrate of the display screen of FIG. 2 according to another embodiment of the present disclosure.
Figure 16:
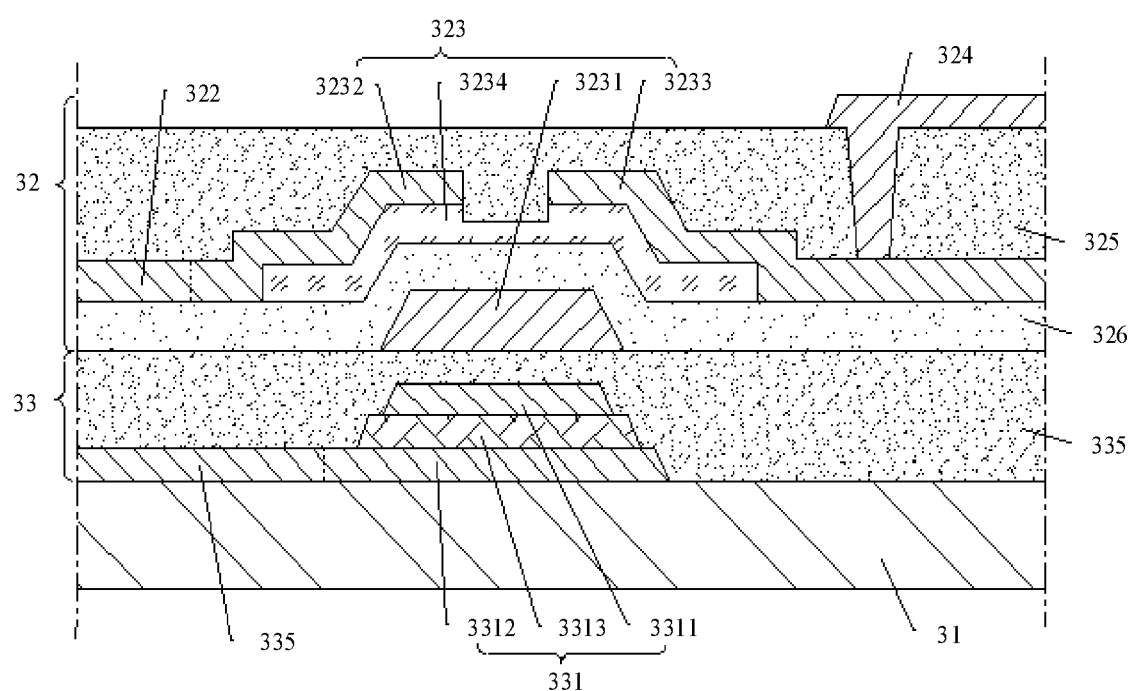
FIG. 16 is a schematic structural diagram illustrating partial structure of the array substrate of FIG. 15.

FIG. 15 is a schematic structural diagram illustrating the array substrate 3 and the color film substrate 1 of the display screen 100 illustrated in FIG. 2 according to Embodiment 5 of the present disclosure. FIG. 16 is a schematic structural diagram illustrating partial structure of the array substrate 3 illustrated in FIG. 15. FIG. 16 mainly illustrates a structure of one TFT 323, a structure of one photoelectric sensor 331, and a structure of one pixel electrode 324. For details of the structure of a circuit of the array substrate 3 of Embodiment 5, reference can be made to Embodiment 1 (FIGS. 4 to 7).

As illustrated in FIG. 15 and FIG. 16, the main difference between Embodiment 5 and Embodiment 4 lies in the following.

The recognition circuit layer 33 is located between the first base material 31 and the display circuit layer 32.

The recognition circuit layer 33 includes the cathode 3312 of the photoelectric sensor 331, the photosensitive layer 3313 of the photoelectric sensor 331, the anode 3311 of the photoelectric sensor 331, and the second planarization layer 335. The recognition circuit layer 33 further includes the multiple output wires 333. The multiple output wires 333 are coupled with the cathodes 3312 of the multiple photoelectric sensors 331 respectively. The display circuit layer 32 further includes the multiple input wires (not illustrated). The multiple input wires 332 are coupled with the anodes 3311 of the multiple photoelectric sensors 331 respectively.

The display circuit layer 32 includes the gate 3231 of the TFT 323, the gate insulation layer 326, the semiconductor layer of the TFT 323, the first end 3232 of the TFT 323, the second end 3233 of the TFT 323, the first planarization layer 325, and the pixel electrode 324. The display circuit layer 32 further includes the data line 322 coupled with the first end 3232 of the TFT 323 and the gate line (not illustrated) coupled with the gate 3231 of the TFT 323.

In this embodiment, the photoelectric sensor 331 is aligned with a channel region of the semiconductor layer 3234 of the TFT 323. Positional relationship between other components can refer to the foregoing embodiments and will not be repeated herein.

Embodiments of the present disclosure have been described in detail above. Principles and embodiments of the present disclosure have been elaborated with specific examples. Description of the above embodiments is only for helping with understanding of the methods and core concept of the present disclosure. The embodiments of the present disclosure and the features in the embodiments can be mutually combined if no conflict is caused. Meanwhile, for those of ordinary skill in the art, changes may be made on specific embodiments and scopes of application according to the core concept of the present disclosure. In summary, the specification is not to be understood as limitation to the present disclosure.

What is claimed is:

1. An array substrate, comprising a first base material, and a display circuit layer and a recognition circuit layer laminated on the first base material;
   wherein the display circuit layer comprises a plurality of gate lines, a plurality of data lines, and a plurality of thin-film transistors (TFT), projections of the plurality of gate lines on the first base material and projections of the plurality of data lines on the first base material defining a plurality of sub-pixel projection areas, and each of projections of the plurality of TFTs on the first base material falling into a corresponding area of the plurality of sub-pixel projection areas; and
   wherein the recognition circuit layer comprises a plurality of photoelectric sensors, projections of the plurality of photoelectric sensors on the first base material falling into a corresponding area of the sub-pixel projection areas, and the photoelectric sensor being configured to sense target lights carrying user fingerprint information;
   wherein the target lights are visible lights, and the display circuit layer is located between the first base material and the recognition circuit layer;

wherein each of the plurality of photoelectric sensors comprises a cathode, a photosensitive layer, and an anode sequentially laminated; the cathode is located on one side of the photosensitive layer towards the first base material; and the anode is made of a transparent conductive material and is located on one side of the photosensitive layer away from the cathode; and wherein the array substrate further comprises a plurality of pixel electrodes, each of projections of the plurality of pixel electrodes on the first base material falls into a corresponding area of the plurality of sub-pixel projection areas, each of the plurality of pixel electrodes is electrically coupled with a corresponding one of the plurality of TFTs, and the plurality of pixel electrodes and the anodes of the plurality of photoelectric sensors are disposed on the same layer.

2. The array substrate of claim 1, wherein the projections of the plurality of photoelectric sensors on the first base material and the projections of the plurality of TFTs on the first base material are partially overlapped.

3. The array substrate of claim 1, wherein the cathode is made of a light-shielding conductive material, and a projection of the cathode on the first base material covers a projection of the photosensitive layer on the first base material.

4. The array substrate of claim 3, wherein the recognition circuit layer further comprises a plurality of output wires, the plurality of output wires are respectively coupled with the cathodes of the plurality of photoelectric sensors, and the plurality of output wires and the cathodes of the plurality of photoelectric sensors are disposed on the same layer and made of the same material, and wherein projections of the plurality of output wires on the first base material and the projections of the plurality of data lines on the first base material are partially overlapped; or the projections of the plurality of output wires on the first base material and the projections of the plurality of gate lines on the first base material are partially overlapped.

5. The array substrate of claim 1, wherein the display circuit layer further comprises a first planarization layer, the first planarization layer is located on one side of the plurality of TFTs away from the first base material and has a plurality of first through-holes, the plurality of first through-holes are aligned with the plurality of TFTs respectively, and the plurality of pixel electrodes are coupled to the plurality of TFTs through the plurality of first through-holes respectively.

6. The array substrate of claim 5, wherein the cathodes of the plurality of photoelectric sensors are located on one side of the first planarization layer away from the first base material;

wherein the recognition circuit layer further comprises an insulation layer, the insulation layer is located on the one side of the first planarization layer away from the first base material and covers the cathodes of the plurality of photoelectric sensors, the insulation layer has a plurality of second through-holes and a plurality of third through-holes, the plurality of second through-holes are aligned with the cathodes of the plurality of photoelectric sensors respectively, and the plurality of third through-holes communicate with the plurality of first through-holes respectively;

wherein the photosensitive layers of the plurality of photoelectric sensors are partially or wholly filled in the plurality of second through-holes respectively and are in contact with the cathodes of the plurality of photoelectric sensors;

wherein the anodes of the plurality of photoelectric sensors are located on one side of the insulation layer away from the first planarization layer and covers the photosensitive layers of the plurality of photoelectric sensors respectively; and wherein the plurality of pixel electrodes are located on the one side of the insulation layer away from the first planarization layer and are coupled to the plurality of TFTs via the plurality of third through-holes and the plurality of first through-holes respectively.

7. The array substrate of claim 1, wherein the target lights are visible lights, and projections of photosensitive layers of the plurality of photoelectric sensors on the first base material and the projections of the plurality of TFTs on the first base material are misaligned.

8. The array substrate of claim 1, wherein the target lights are invisible lights, and the projections of the plurality of photoelectric sensors on the first base material and the projections of the plurality of TFTs on the first base material are partially overlapped.

9. The array substrate of claim 8, wherein the display circuit layer is located between the first base material and the recognition circuit layer.

10. The array substrate of claim 8, wherein the recognition circuit layer further comprises a plurality of output wires, the plurality of output wires are coupled with cathodes of the plurality of photoelectric sensors respectively, and the plurality of output wires and the cathodes of the plurality of photoelectric sensors are disposed on the same layer and made of the same material; and projections of the plurality of output wires on the first base material are partially overlapped with one of the projections of the plurality of gate lines on the first base material and the projections of the plurality of data lines on the first base material.

11. The array substrate of claim 10, wherein the display circuit layer further comprises a plurality of input wires, the plurality of input wires are coupled with anodes of the plurality of photoelectric sensors respectively, and the plurality of input wires and the anodes of the plurality of photoelectric sensors are disposed on the same layer and made of the same material;

the plurality of input wires and the plurality of output wires are made of the same material; and projections of the plurality of input wires on the first base material are partially overlapped with the other one of the projections of the plurality of gate lines on the first base material and the projections of the plurality of data lines on the first base material.

12. A display screen, comprising a color film substrate, a liquid crystal layer, an array substrate, a gate driver circuit, and a data driver circuit;

wherein the liquid crystal layer is located between the color film substrate and the array substrate;

wherein the array substrate, comprises a first base material, and a display circuit layer and a recognition circuit layer laminated on the first base material;

wherein the display circuit layer comprises a plurality of gate lines, a plurality of data lines, and a plurality of thin-film transistors (TFT), projections of the plurality of gate lines on the first base material and projections of the plurality of data lines on the first base material defining a plurality of sub-pixel projection areas, and each of projections of the plurality of TFTs on the first base material falling into a corresponding area of the plurality of sub-pixel projection areas;

wherein the recognition circuit layer comprises a plurality of photoelectric sensors, projections of the plurality of photoelectric sensors on the first base material falling into a corresponding area of the sub-pixel projection areas, and the photoelectric sensor being configured to sense target lights carrying user fingerprint information; and wherein the plurality of gate lines are electrically coupled with the gate driver circuit, the plurality of data lines are electrically coupled with the data driver circuit, and each of the plurality of photoelectric sensors has one end electrically coupled with the gate driver circuit and the other end electrically coupled with the data driver circuit.

13. The display screen of claim 12, wherein the color film substrate comprises a second base material and a color resist layer disposed under the second base material, the color resist layer has black matrices with a plurality of light-transmitting holes, the target lights are visible lights, and the photosensitive layers of the plurality of photoelectric sensors are aligned with the plurality of light-transmitting holes respectively.

14. The display screen of claim 12, wherein the color film substrate comprises a second base material and a color resist layer disposed under the second base material, the target lights are visible lights, and the photosensitive layers of the plurality of photoelectric sensors are aligned with color resist blocks of the color resist layer.

15. The display screen of claim 12, wherein the color film substrate comprises a second base material and a color resist layer disposed under the second base material, the target lights are invisible lights, and the photosensitive layers of the plurality of photoelectric sensors are aligned with black matrices of the color resist layer.

16. An electronic device, comprising a controller and a display screen, and the controller being electrically coupled with the display screen;

wherein the display screen comprises a color film substrate, a liquid crystal layer, an array substrate, a gate driver circuit, and a data driver circuit, the liquid crystal layer being located between the color film substrate and the array substrate;

wherein the array substrate comprises a first base material, and a display circuit layer and a recognition circuit layer laminated on the first base material;

wherein the display circuit layer comprises a plurality of gate lines, a plurality of data lines, and a plurality of thin-film transistors (TFT), projections of the plurality of gate lines on the first base material and projections of the plurality of data lines on the first base material defining a plurality of sub-pixel projection areas, and each of projections of the plurality of TFTs on the first base material falling into a corresponding area of the plurality of sub-pixel projection areas;

wherein the recognition circuit layer comprises a plurality of photoelectric sensors, projections of the plurality of photoelectric sensors on the first base material falling into a corresponding area of the sub-pixel projection areas, and the photoelectric sensor being configured to sense target lights carrying user fingerprint information; and wherein the plurality of gate lines are electrically coupled with the gate driver circuit, the plurality of data lines are electrically coupled with the data driver circuit, and each of the plurality of photoelectric sensors has one end electrically coupled with the gate driver circuit and the other end electrically coupled with the data driver circuit.

* * * * *